(12) United States Patent
Asakura et al.

(10) Patent No.: US 6,477,771 B2
(45) Date of Patent: Nov. 12, 2002

(54) TERMINAL CRIMPING METHOD AND TERMINAL CRIMPING APPARATUS

(75) Inventors: Nobuyuki Asakura, Shizuoka (JP); Yasumichi Kuwayama, Shizuoka (JP); Masanori Onuma, Shizuoka (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 09/915,562

(22) Filed: Jul. 27, 2001

(65) Prior Publication Data

US 2002/0013084 A1 Jan. 31, 2002

(30) Foreign Application Priority Data

Jul. 27, 2000 (JP) ......................................... 2000-227225

(51) Int. Cl.[7] .............................................. H01B 43/04
(52) U.S. Cl. .............................. 29/882; 29/874; 29/882; 29/883; 29/857; 29/747; 29/751; 29/753
(58) Field of Search ........................ 29/874, 882, 883, 29/857, 747, 751, 753

(56) References Cited

U.S. PATENT DOCUMENTS

| | | | |
|---|---|---|---|
| 3,924,917 A | * 12/1975 | Munshower | 174/84 C |
| 4,490,904 A | * 1/1985 | Moyher | 227/120 |
| 5,112,244 A | 5/1992 | Kuzuno et al. | |
| 5,484,961 A | * 1/1996 | Itoh et al. | 174/84 C |
| 5,901,439 A | * 5/1999 | Endo et al. | 29/33 M |

* cited by examiner

Primary Examiner—Charles G. Freay
Assistant Examiner—Emmanuel Sayoc
(74) Attorney, Agent, or Firm—Sughrue Mion, PLLC

(57) ABSTRACT

A terminal crimping apparatus (21) comprises a lower crimper (23) for supporting the lower side of a flat part (6) of an electrically connecting terminal (42); an upper crimper (25) arranged above and opposite to the lower crimper (23) and having molding faces (25a, 25b) for bending to deform the point portions of piercing parts (7, 8) opposite each other by relatively moving toward the lower crimper (23); terminal guides arranged as being movable along and relative to the outer sides of the piercing parts (7, 8) of the electrically connecting terminal (42) disposed on the lower crimper (23) so as to control the piercing parts (7, 8) from falling; and circuit body holders (32, 33) arranged above and opposite to the terminal guides (27, 28) for elastically holding the flat circuit body (1) in cooperation with the terminal guides (27, 28) while the upper crimper (25) moves toward the lower crimper (23).

10 Claims, 10 Drawing Sheets

TERMINAL CRIMPING METHOD AND TERMINAL CRIMPING APPARATUS

BACKGROUND OF THE INVENTION

1. Technical Field Of The Invention

The present invention relates to improvements of a terminal crimping method for electrically connecting an electric terminal to a flat circuit body by penetrating a point portions of at least a pair of piercing parts erected from opposite side edges of a flat part of an electrically connecting terminal through a cover and a conductor of the flat circuit body and bending the point portions so as to approach each other, and a terminal crimping apparatus therefor.

2. Related Art

Figure 11:
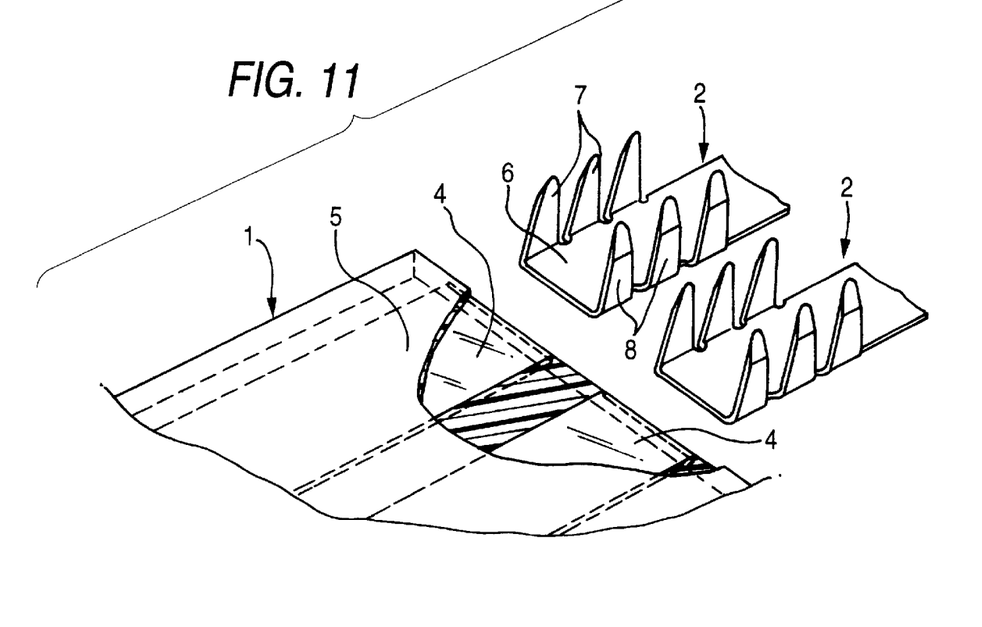
FIG. 11 is a perspective view of elemental parts of the electrically connecting terminal to be crimped to the flat circuit body.

FIG. 11 shows the flat circuit body 1 and the electrically connecting terminal 2 to be connected thereto.

The flat circuit body 1 is an FFC (Flexible Flat Cable) in which a plurality of lengthy and thin sheet like conductors 4 are covered with a thin film isolating cover 5 and are finished up as a generally flexible band-like cable. The conductors 4 may be formed by pattern-printing or attaching conductive material previously formed as a tape onto an isolating sheet.

The electrically connecting terminal 2 comprises a flat part 6, a plurality of pairs of piercing parts 7, 8 erected from opposite side edges of the flat part 6 at the base side, and a terminal connecting part (not shown) formed at the distal end side of the flat part 6 and is integrally formed by pressing a metal plate.

The terminal connecting part (not shown) is for connecting another connecting terminal, and may be formed, for example, as a female or male structure to be placed in a connector housing.

Figure 12:
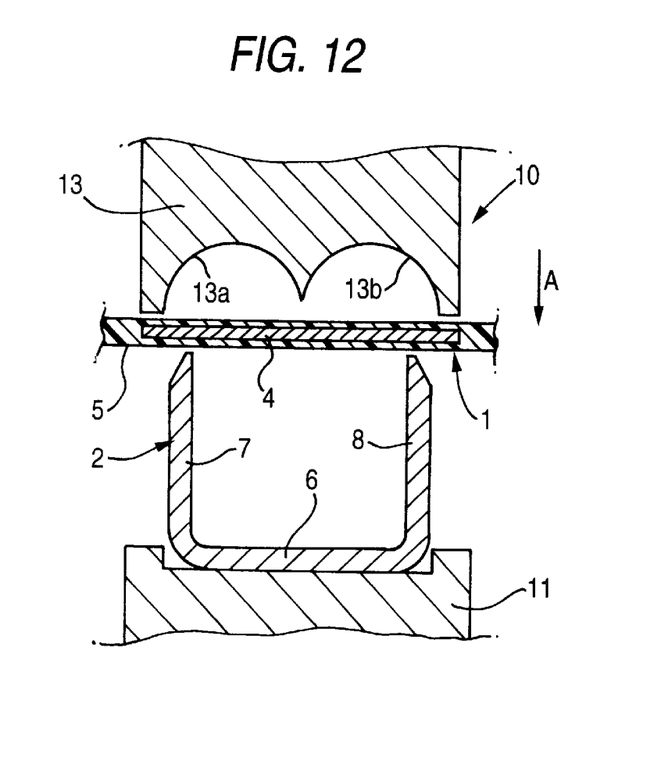
FIG. 12 is a cross sectional view of the related terminal crimping apparatus for explaining the related crimping method.
Figure 13:
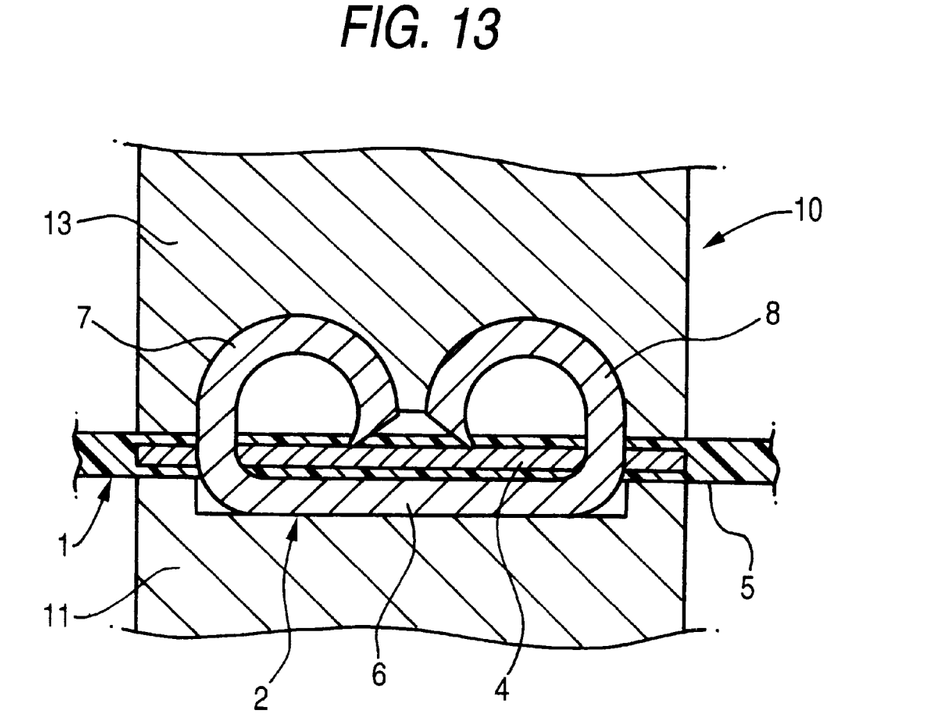
FIG. 13 is a cross sectional view showing that the terminal crimping apparatus of FIG. 12 accomplished the crimping process.

FIGS. 12 and 13 show a related terminal crimping apparatus 10 generally in cross section for crimping the electrically connecting terminal 2 to the flat circuit body 1.

The terminal crimping apparatus 10 is provided with a lower crimper 11 for supporting the lower side of the flat part 6 of the electrically connecting terminal 2, and an upper crimper 13 arranged above and opposite to the lower crimper 11 and having molding faces 13a, 13b for bending the point portions of the piercing parts 7, 8 standing oppositely each other.

Crimping of the electrically connecting terminal 2 in the terminal crimping apparatus 10 is, as shown in FIG. 12, carried out at first by arranging the flat circuit body 1 between the electrically connecting terminal 2 placed on the lower crimper 11 and the upper crimper 13, and subsequently by moving down the upper crimper 13 as indicated by an arrow A so that the lower crimper 11 and the upper crimper 13 come close to each other.

Then, the piercing parts 7, 8 of the electrically connecting terminal 2 penetrate through the flat circuit body 1, and as shown in FIG. 13, the point potions of the piercing parts 7, 8 projected from the flat circuit body 1 on the upper side thereof are bent back toward the flat circuit body 1, thereby crimping the electrically connecting terminal 2 to the flat circuit body 1.

Figure 14:
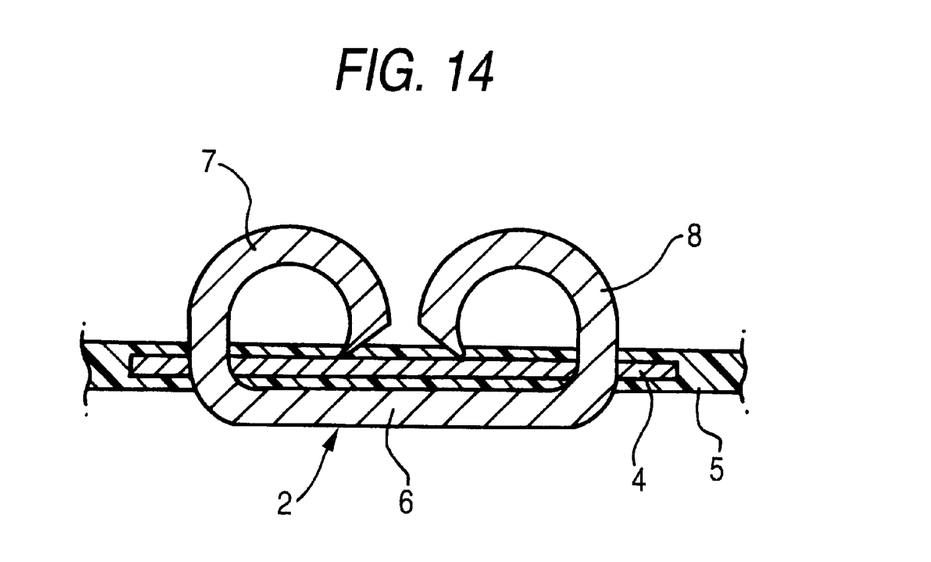
FIG. 14 is a laterally cross sectional view of the electrically connecting terminal crimped to the flat circuit body.

FIG. 14 shows in cross section the piercing parts 7, 8 of the electrically connecting terminal 2 crimped to the flat circuit body 1 by the terminal crimping apparatus 10.

The piercing parts 7, 8 penetrates through the conductor 4 and the isolating cover 5 of the flat circuit body 1 for electrically connection with the electric conductor 4. Further, the point portion of the piercing parts 7, 8 are bent back toward the flat circuit body 1 until the point portion pierces the flat circuit body 1 again, thereby crimping the electrically connecting terminal 2 to the flat circuit body 1.

Figure 15:
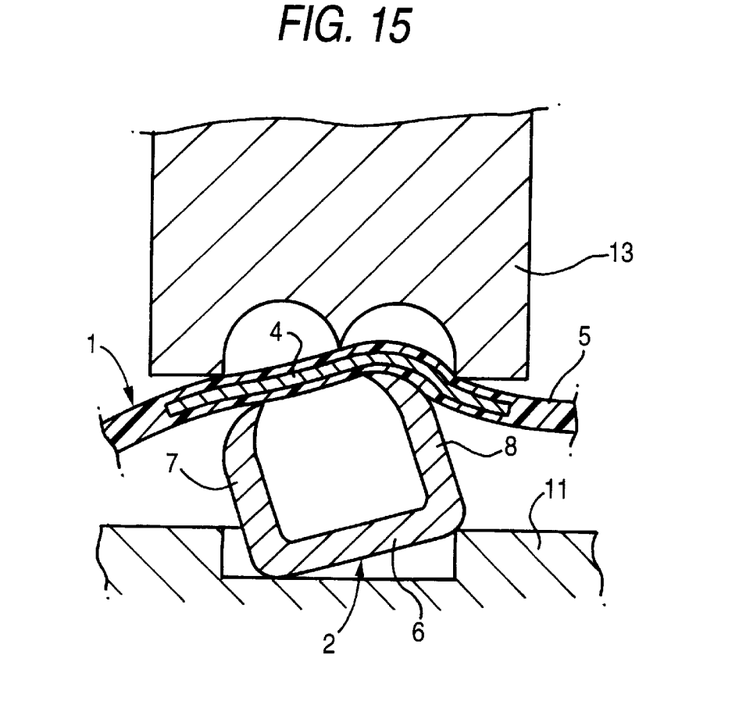
FIG. 15 is a cross sectional view showing the condition where the electrically connecting terminal is displaced from position in the related terminal crimping apparatus shown in FIG. 13.

However, according to the related terminal crimping apparatus 10, as shown in FIG. 12, in case the crimping operation is started with the electrically connecting terminal 2 and the flat circuit body 1 being in order set on the lower crimper 11, the flat circuit body 1 may, for example, slightly displace in the face direction (back and forth, right and left in FIG. 12) or vibrate. In this case, the electrically connecting terminal 2 having the point portions of the piercing parts 7, 8 being in contact with the flat circuit body 1 is probably displaced from position as shown in FIG. 15.

Figure 16:
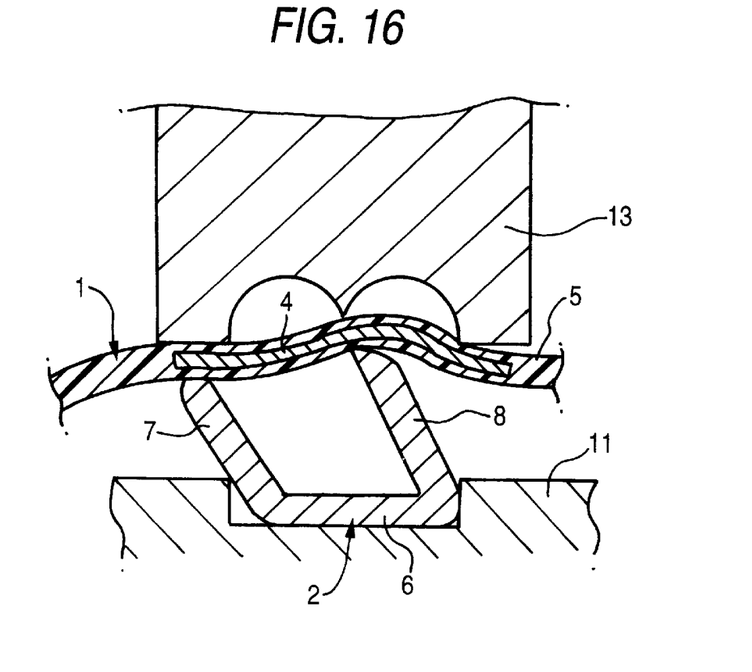
FIG. 16 is a laterally cross sectional view showing the condition where the piercing parts are buckled owing to the displacement in the electrically connecting terminal in the conventional terminal crimping apparatus of FIG. 13.

A problem is involved that if both crimpers 11, 13 are brought close to each other in above case, the piercing parts 7, 8 maybe buckled as shown in FIG. 16 to generate bad crimping.

SUMMARY OF THE INVENTION

It is accordingly an object of the invention to eliminate the above mentioned problems and to provide a terminal crimping method and an apparatus therefor which are least to cause inferior crimping owing to buckling of the piercing parts and may operate crimping of high quality.

The object of the invention may be attained by a terminal crimping method of electrically connecting an electrically terminal having a pair of piercing parts and a flat part to a flat circuit body including a cover and a conductor therein by a terminal crimping apparatus including an upper crimper, a lower crimper, a terminal guide and a circuit body holder the terminal crimping method comprising the steps of:

placing the electrically connecting terminal on the lower crimper;

guiding the pair of piercing parts by the terminal guide relatively movable along outer sides of the pair of piercing parts;

elastically holding the flat circuit body disposed between the upper crimper and the lower crimper by the terminal guide and the circuit body holder;

relatively moving the upper crimper toward the lower crimper;

piercing the cover and the conductor by point portions of the pair of piercing parts; and bending the point portions of the pair of piercing parts so as to approach each other by a molding face of the upper crimper.

Further, the object of the invention may be attained by a terminal crimping apparatus for electrically connecting an electrically connecting terminal having a pair of piercing parts and a flat part to a flat circuit body having a cover and a conductor therein, the terminal crimping apparatus comprising:

a lower crimper which supports a lower side of the flat part;

an upper crimper arranged above to the lower crimper having a molding surface for bending point portions of the pair of piercing parts by relatively moving toward the lower crimper;

a terminal guide movable along outer sides of the pair of piercing parts for guiding the pair of piercing parts; and a circuit body holder arranged above and opposite to the terminal guide for elastically holding the flat circuit body in cooperation with the terminal guides during the upper crimper moves toward the lower crimper.

According to the above mentioned structure, while the upper crimper is relatively moved toward the lower crimper to penetrate, at the point portions, the piercing parts of the electrically connecting terminal into the flat circuit body and deform the same by bending toward each other, the flat circuit body is sandwiched between the circuit body holders and the terminal guides arranged as being movable along and relative to the outer side of the piercing portions, and at the same time the piercing parts of the electrically connecting terminal are prevented from falling by the terminal guides.

Further, in the process for crimping the electrically connecting terminal to the flat circuit body, when the piercing parts penetrate into the flat circuit body, the flat circuit body is prevented from slight displacement in the face direction and from vibrations while the portions to be penetrated are maintained as being tensed. The positional relationship with the point portions of the piercing parts is stabilized, so that the piercing parts may penetrate into the flat circuit body under a balanced condition.

Further, the piercing parts of the electrically connecting terminal controlled from falling by the terminal guides may be deformed as being bent toward each other without being deviation.

Therefore, according to the terminal crimping method and the apparatus therefor, inferior crimping owing to buckling of the piercing parts is least to occur, and the crimping of high quality may be carried out.

Preferably, by means of the molding face, one of the pair of piercing parts penetrating at the point portion of said one through the flat circuit body is bent back toward said flat part of the electrically connecting terminal to again penetrate through the conductor by means of the molding face of the upper crimper, while the point portion of the other piercing part is laid upon said one of the point parts such that said one is urged toward said flat part.

In this case, when the pair of piercing parts penetrating the flat circuit body are bent back, since one of the point portions is laid upon the other point portion, the pair of piercing parts may have occupation width enough with width occupied by one of the other piercing parts. Thus, the width occupied by one electrically connecting terminal on the flat circuit body may be largely reduced, and the electric conductors may be arranged with a narrower pitch provided therebetween on the flat circuit body.

Further, since the point portion of one piercing part which penetrates the flat circuit body and then is in advance bent back, again pierces the conductor of the flat circuit body and is held down by the point portion of the other pierce part, the one piercing part may be prevented from spring back by the point portions of the other piercing part.

Therefore, fixation of the electrically connecting terminal to the flat circuit body is not loosened by spring back, and reliability to electric conductivity of the flat circuit body may be heightened.

DETAILED DESCRIPTION OF PREFERRED EMBODIMENT

The terminal crimping method and the apparatus therefor will be explained in detail in accordance with an embodiment of the invention, referring to the attached drawings.

Figure 1:
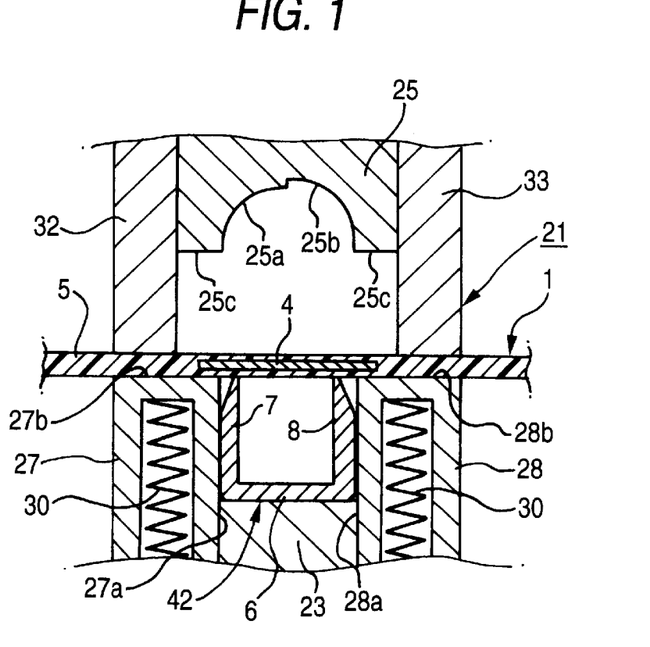
FIG. 1 is a cross sectional view for explaining the terminal crimping method by use of the terminal crimping apparatus relating to one embodiment of the invention.
Figure 2:
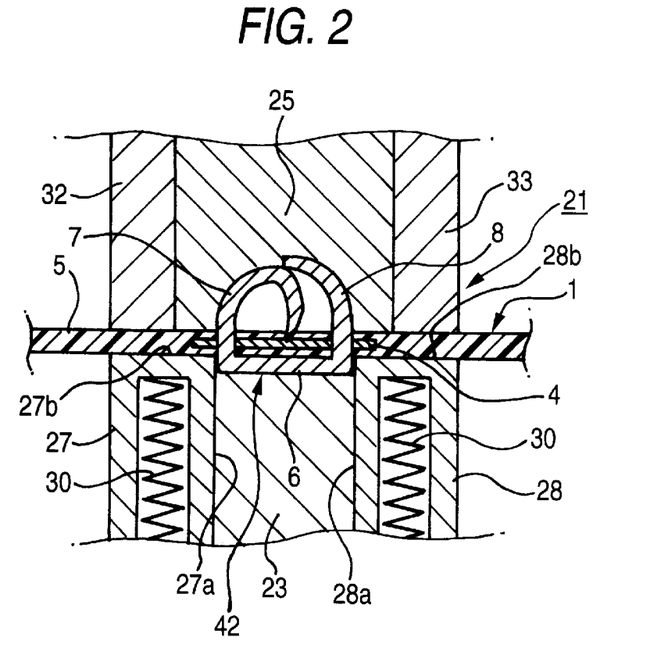
FIG. 2 is a cross sectional view of the terminal crimping apparatus accomplishing the crimping operation by means of the apparatus of FIG. 1.
Figure 3:
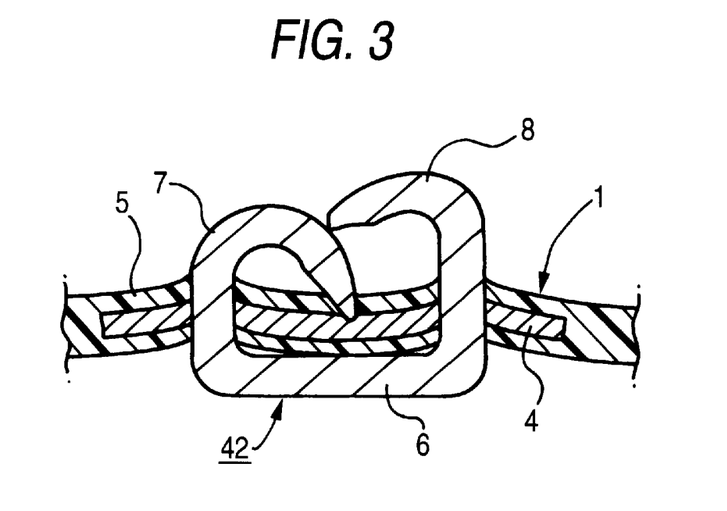
FIG. 3 is a laterally cross sectional view of the electrically connecting terminal crimped to the flat circuit body by the apparatus shown in FIG. 1.
Figure 4:
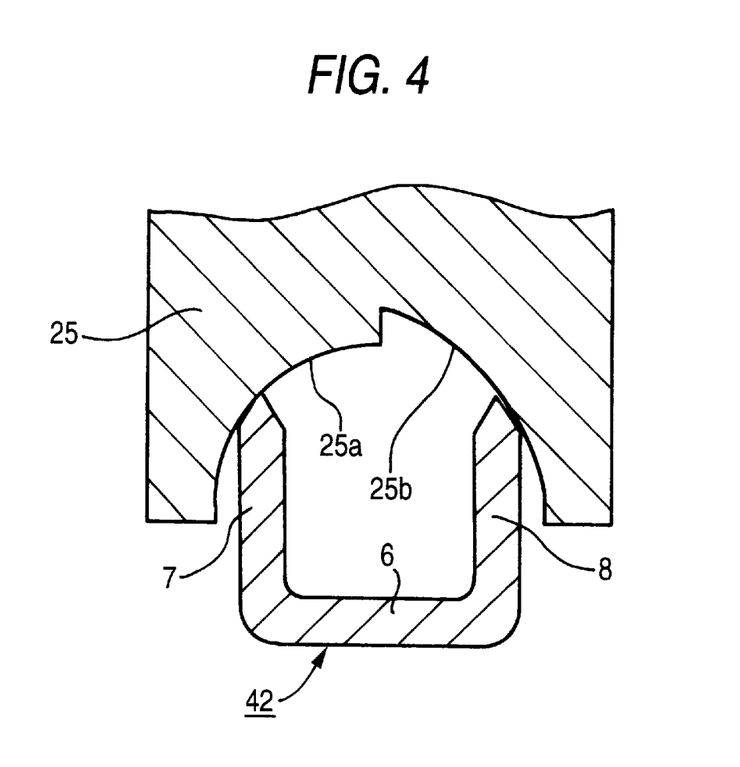
FIG. 4 is a cross sectional view of the molding face of the upper crimper shown in FIG. 1.
Figure 5:
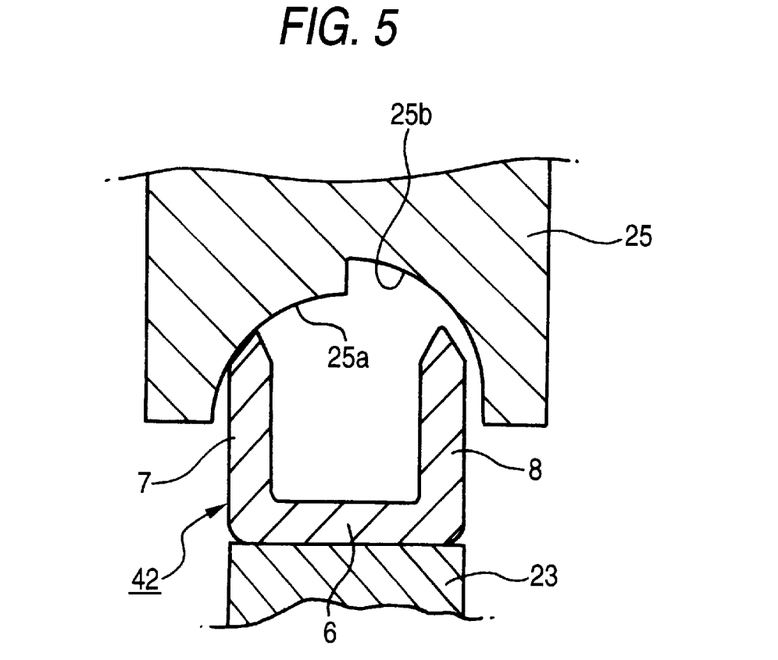
FIG. 5 is a cross sectional view for explaining the problem when the molding face of the upper crimper shown in FIG. 4 is not rationalized.
Figure 6:
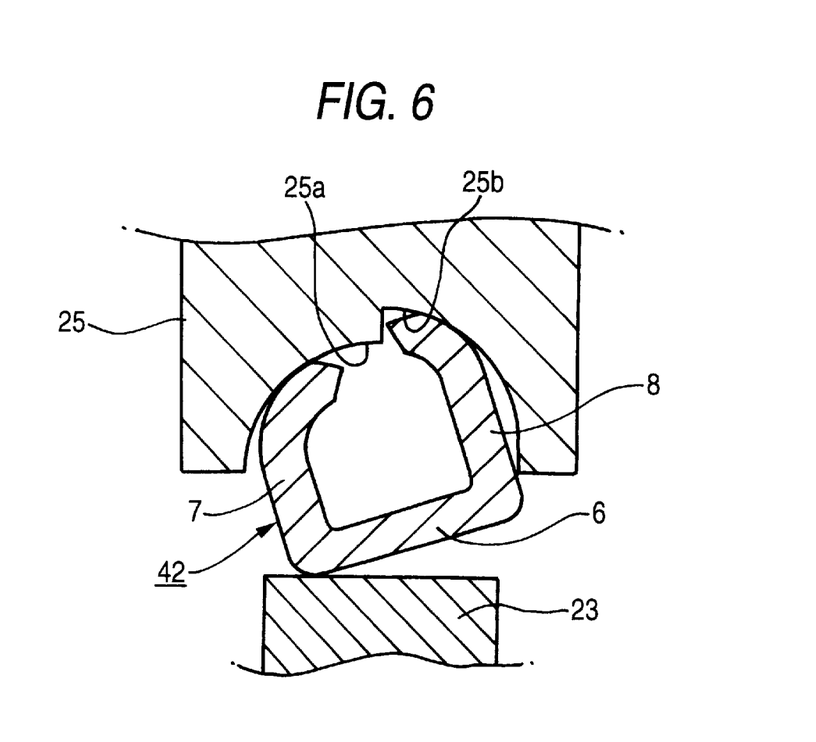
FIG. 6 is a cross sectional view for explaining the problem when the molding face of the upper crimper shown in FIG. 4 is not rationalized.
Figure 7A:
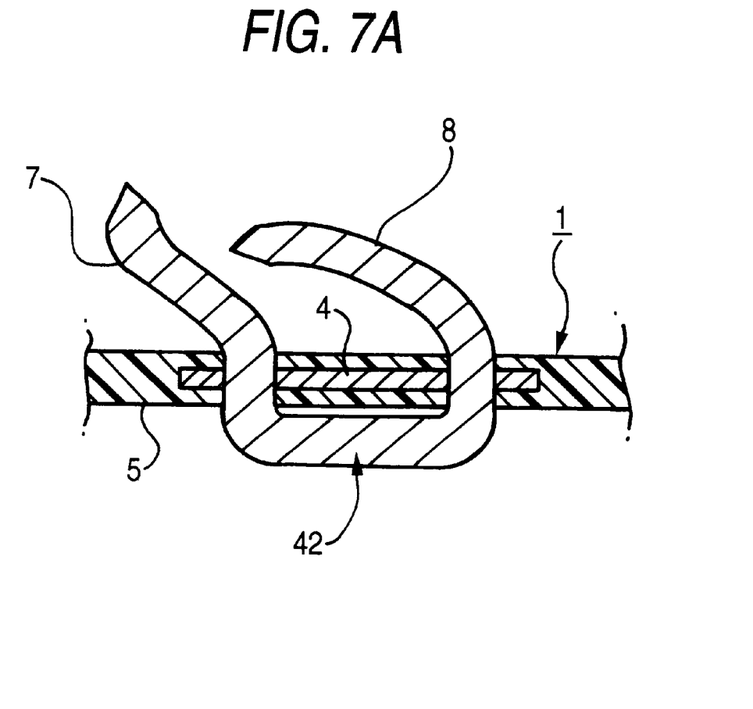
FIGS. 7A and 7B are cross sectional views of the electrically connecting terminals when the crimping is progressed under the condition shown in FIG. 6.
Figure 7B:
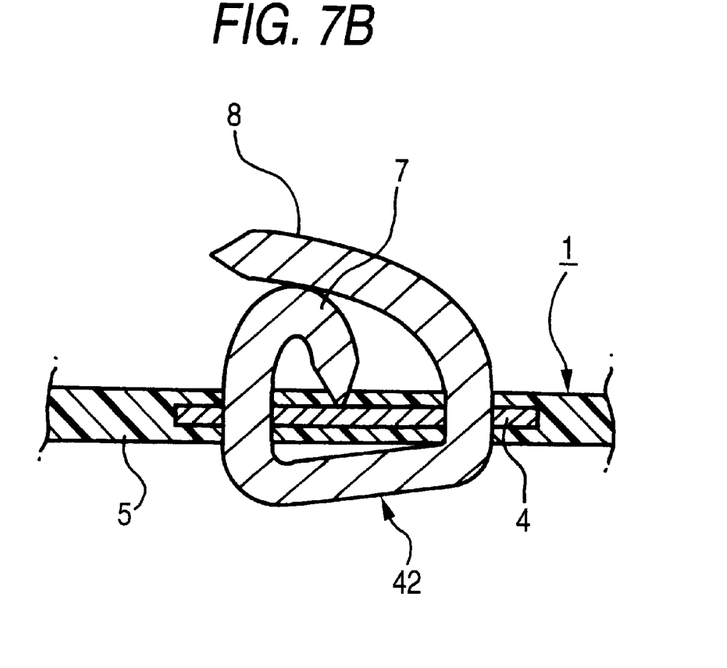

FIG. 1 is across sectional view for explaining the terminal crimping method by use of the terminal crimping apparatus relating to the embodiment of the invention. FIG. 2 is a cross sectional view of the terminal crimping apparatus accomplishing the crimping operation by using the apparatus of FIG. 1. FIG. 3 is a laterally cross sectional view of the electrically connecting terminal crimped to the flat circuit body by the apparatus shown in FIG. 1. FIG. 4 is a cross sectional view of the molding face of the upper crimper shown in FIG. 1. FIGS. 5 and 6 are cross sectional views for explaining the problems when the molding face of the upper crimper shown in FIG. 4 is not suitably adjusted. FIG. 7 is laterally cross sectional views of the electrically connecting terminals when the crimping is progressed under the condition shown in FIG. 6.

The terminal crimping apparatus 21 according to the embodiment is for crimping an electrically connecting terminal 42 to the flat circuit body 1.

The flat circuit body 1 has the same structure as that of the flat circuit body 1 shown in FIG. 11, and is the FFC (Flexible Flat Cable) in which a plurality of lengthy and thin sheet-like conductors 4 are covered with a thin film isolating cover 5 and are finished up as a generally flexible band-like cable. The invention may also use an FPC (Flexible Printed Cable) as the flat circuit body, the conductor of which is pattern-printed.

The electrically connecting terminal 42 is substantially the same as the related electrically connecting terminal 2 as shown in FIG. 11 except that the space between a plurality of pair of piercing parts 7, 8 is made narrower than that of the related one. The point portions of the piercing parts 7, 8 as the pair penetrate the cover 5 and the conductors 4 of the flat circuit body 1, and subsequently the point portions are bent so as to approach each other by the terminal crimping apparatus 21. Thus the electrically connecting terminal 42 is connected to the flat circuit body 1. Namely this is so called piercing terminal.

The terminal crimping apparatus 21 according to the embodiment comprises: a lower crimper 23 for supporting the lower side of the flat part 6 of the electrically connecting terminal 42; an upper crimper 25 arranged above and opposite to the lower crimper 23 and having molding faces 25a, 25b for bending and deforming the point portions of the piercing parts 7, 8 opposite each other by relatively moving the upper crimper 25 toward the lower crimper 23; terminal guides 27, 28 arranged as being movable along and relative to the outer sides of the piercing parts 7, 8 of the electrically connecting terminal 42 disposed on the lower crimper 23 so as to control the piercing parts 7, 8 from falling; and circuit body holders 32, 33 arranged above and opposite to the terminal guides 27, 28 for elastically holding the flat circuit body 1 in cooperation with the terminal guides 27, 28 while the upper crimper 25 is moved toward the lower crimper 23.

The pair of terminal guides 27, 28 are provided with guide faces 27a, 28a and circuit body support faces 27b, 28b, the guide faces 27a, 28a being located along the outer sides of the piercing parts 7, 8 of the electrically connecting terminal 42 on the lower crimper 23 to control falling of the piercing parts 7, 8 toward the outside, and the circuit body support faces 27b, 28b being located as contacting to the lower side of the flat circuit body 1 to support the same.

Each of the terminal guides 27, 28 is elastically supported by a compression coil spring 30 at the side of the lower crimper 23 to enable to go down. When the flat circuit body 1 is pressed down to the lower crimper 23 by pressing force of the upper crimper 25, the terminal guides 27, 28 are movable relative to the lower crimper 23 together with the flat circuit body 1.

The circuit holders 32, 33 are arranged opposite to the terminal guides 27, 28, and elastically press down the flat circuit body 1 against the circuit body support faces 27b, 28b by an elastically urging member (not shown) which communicate to the upper crimper 25. Pressing force of the elastically urging member is set smaller than the repulsion of the compression coil springs 30.

The upper crimper 25 may be vertically moved by a driving unit (not shown) and the lower crimper 23 is placed on a base of this apparatus.

Next, explanation will be made to a crimping process of the electrically connecting terminal 42 by the terminal crimping apparatus 21.

At first, the flat circuit body 1 is placed between the electrically connecting terminal 42 located on the lower crimper 23 and the upper crimper 25. The circuit holders 32, 33 are then moved down together with the upper crimper 25 until the circuit holders 32, 33 come to elastically hold the flat circuit body 1 in cooperation with the terminal guides 27, 28 as shown in FIG. 1.

Then, the piercing parts 7, 8 of the electrically connecting terminal 42 are in contact with or slightly spaced from the lower side of the flat circuit body 1, while the upper crimper 25 is spaced upward from the flat circuit body 1 as shown in FIG. 1.

Subsequently, the upper crimper 25 is moved down toward the lower cripmer 23 until the lower end face 25c thereof comes to contact with the upper face of the flat circuit body 1, and the upper crimper 25 is relatively moved toward the lower crimper 23.

The upper crimper 25 is further moved down to push the flat circuit body 1 toward the lower crimper 23 together with the terminal guides 27, 28 against spring action of the compression coil springs 30, so that, as shown in FIG. 2, the piercing parts 7, 8 of the electrically connecting terminal 42 pierce the flat circuit body 1, and then the point portions of the piercing parts 7, 8 appearing on the upper side of the flat circuit body 1 are bent toward the flat part 6 by the molding surfaces 25a, 25b of the upper crimper 25, and the electrically connecting terminal 42 is crimped to the flat circuit body 1.

In this case, the flat circuit body 1 is held between the circuit body holders 32, 33 and the terminal guides 27, 28 which are relatively movable along the outer side of the piercing parts 7, 8, and the piercing parts 7, 8 of the electrically connecting terminal 42 are prevented from falling by the terminal guides 27, 28.

Since the terminal guides 27, 28 are elastically supported as movable downward, and when they are pushed down by the upper crimper 25 descending together with the circuit body holders 32, 33, even if the piercing parts 7, 8 are bent and deformed to lower height thereof, the piercing portions 7, 8 is exactly prevented from falling, and the flat circuit body 1 can be held as maintaining horizontal.

That is, in the crimping process of conductively connecting the electrically connecting terminal 42 to the flat circuit body 1, when the piercing parts 7, 8 penetrate through the flat circuit body 1, the flat circuit body 1 is avoided from fine displacement or vibration in the face direction and a part to be pierced is made tense. Therefore, the relative positions between the flat circuit body 1 and the piercing parts 7, 8 are stabilized to enable the piercing parts 7, 8 to pass through the flat circuit body 1 in a balanced condition.

Further, the piercing parts 7, 8 of the electrically connecting terminal 42 prevented from falling by the terminal guides 17, 28 may be correctly bent toward each other and deformed without deviation.

Thus, there less occurs poor crimping by buckling of the piercing parts 7, 8, and the crimping process of a high quality is available.

Further, according to the embodiment of the terminal crimping apparatus 21, the molding faces 25a, 25b of the upper crimper 25 bend to deform the piercing parts 7, 8 such that one piercing part 8 lies upon the other piercing part 7 as seen in the electrically connecting terminal 42 shown in FIG. 3.

The molding faces 25a, 25b of the upper crimper 25 are, therefore, of curves having different radius of curvature as shown in FIGS. 1 and 2 so as to lay one piercing part 8 upon the other 7.

As shown in FIG. 3, the point portion of one 7 of the pair of piercing portions 7, 8 penetrating the cover 5 and the conductor 4 of the flat circuit body 1 is bent back to the flat portion 6 and again passes through the conductor 4, while the other 8 is laid on the point portion of the one piercing part 7 such that the point portion of the piercing part 7 is urged toward the flat part 6, whereby the piercing parts 7, 8 are connected to the flat circuit body 1.

Namely, according to the electrically connecting terminal 42 of the present embodiment, when the pair of the piercing parts 7, 8 penetrate the flat circuit body 1 and turn back, the one 8 lies at the point portion on the other piercing parts 7. Therefore, the pair of piercing portions 7, 8 may have the occupation width enough with the width occupied by one of the piercing parts 7, 8.

As shown in FIG. 14, comparing with a related electrically connecting terminal 2 where a pair of piercing parts 7, 8 should have individual occupation widths and must have a space therebetween, the electrically connecting terminal 42 of the instant embodiment may largely reduce the occupation width on the flat circuit body 1, and a plurality of electric conductors 4 may be arranged on the flat circuit body 1 with a narrower space therebetween. Thus, the flat circuit body 1 may be made narrower in width.

Further, since one point portion of one piercing part 7 which penetrates the flat circuit body 1 and then is in advance bent back, again pierces the conductor 4 of the flat circuit body 1 and is laid down by the point portion of the other pierce part 8, the one piercing part 7 may be prevented from spring back by the point portions of the other piercing part 8.

Therefore, the fixation of the electrically connecting terminal to the flat circuit body is not loosened due to spring back, and the reliability to electric conductivity of the flat circuit body may be heightened.

When the lower crimper 23 and the upper crimper 25 are moved toward each other, the molding faces 25a, 25b of the upper crimper 25 in the terminal crimping apparatus 21 are, as shown in FIG. 4, determined with respect to respective dimensions of center of curvature and radius of curvature such that the piercing parts 7, 8 of the electrically connecting terminal 42 come to simultaneously contact the molding faces 25a, 25b at the point portions thereof.

That is, when the piercing parts 7, 8 are crimped at the point portions thereof by the upper crimper 25, if a space exists between the one piercing part 8 and the corresponding molding face 25a, though the other piercing portion 7 is in contact with the corresponding molding face 25b as shown in FIG. 5, the electrically connecting terminal 42 might be inclined between the lower crimper 23 and the upper crimper 25 as shown in FIG. 6.

If the crimping goes on as it is, buckling occurs in the piercing parts as seen in FIG. 7A, otherwise the point portions of the piercing parts 7, 8 may not be correctly bent as seen in FIG. 7B, and an electric connection might not be stabilized.

Therefore, in order that the piercing parts 7, 8 are bent and deformed such that one 8 is laid upon the other 7 as is realized in the electrically connecting terminal 42 of the present embodiment, the point portions of the piercing parts 7, 8 of the electrically connecting terminal 42 may be set to simultaneously contact with the respective molding faces 25a, 25b.

Figure 8:
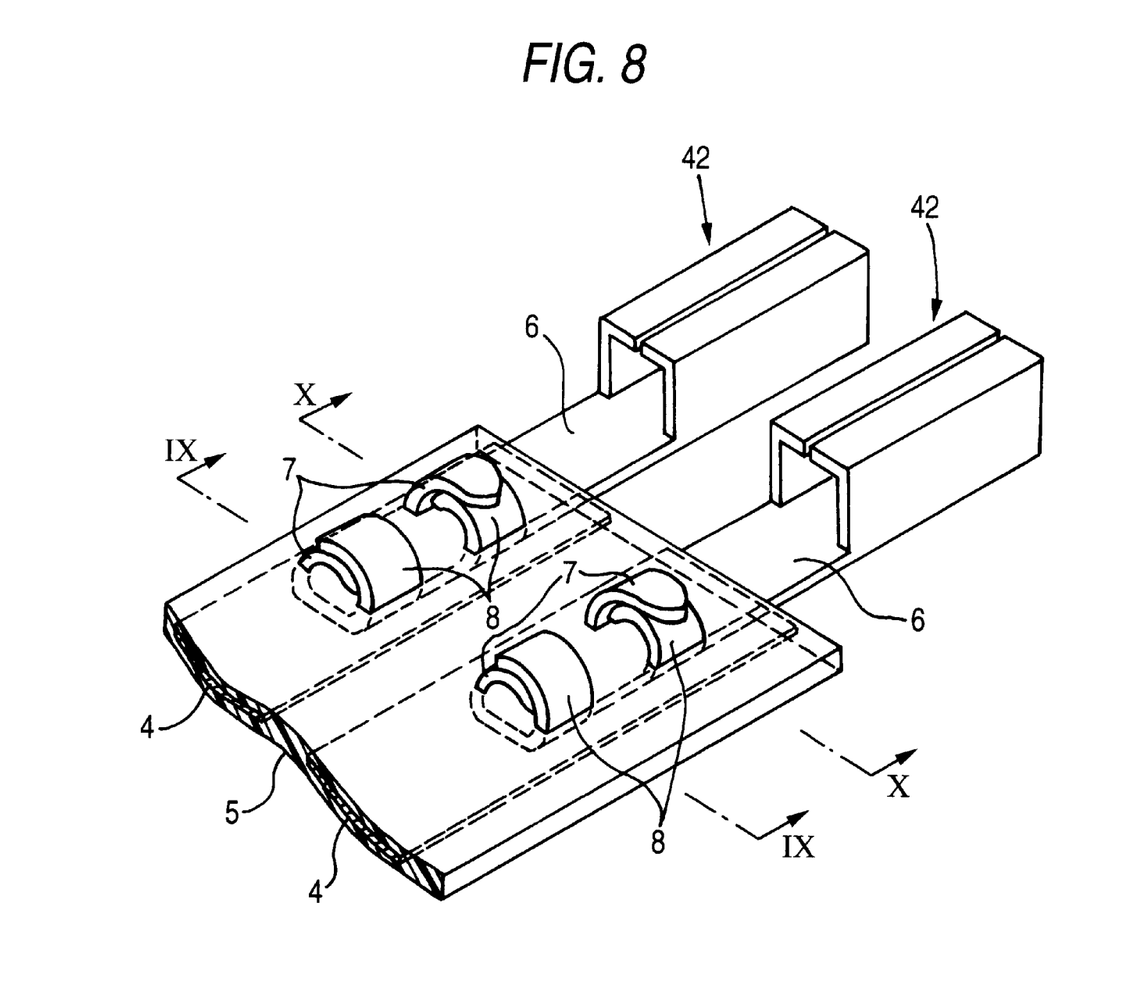
FIG. 8 is a perspective view of elemental parts showing a modified example of the electrically connecting terminal to be crimped to the flat circuit body.

Further, as shown in FIG. 8, if the electrically connecting terminal 42 has plural pairs of piercing parts 7, 8, it is recommended to reverse the manner of laying one piercing part 8 (7) upon the other piercing part 7 (8) per each of the pairs.

Figure 9:
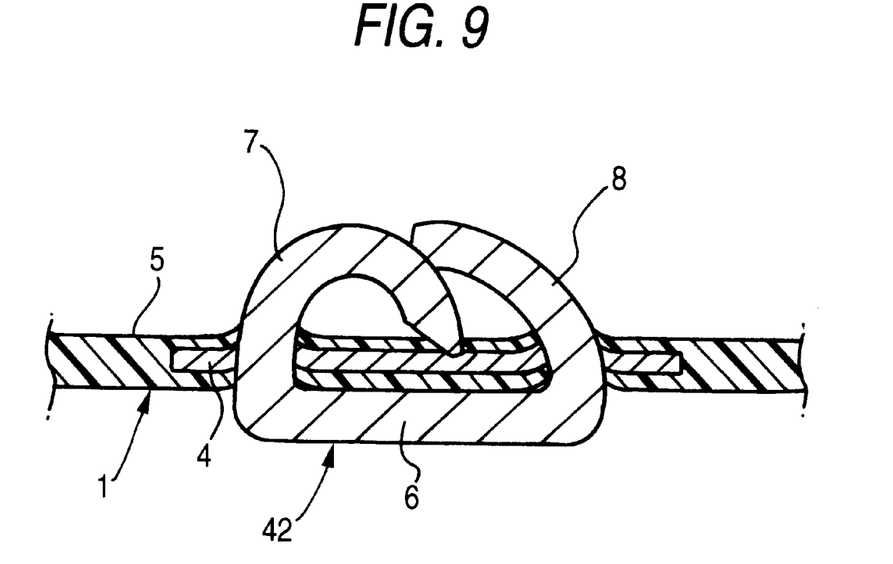
FIG. 9 is a view taken along IX—IX of FIG. 8.

Namely, as shown in FIG. 9, the pair of piercing parts 7, 8 standing at the base end side of the flat part 6 of the electrically connecting terminal 42 are connected to the flat circuit body 1, where the piercing parts 7, 8 penetrate the cover 5 and the electric conductor 4, and the point portion of one piercing part 7 is bent back to the flat part 6 to again pierce the electric conductor 4 and the point portion of the one piercing part 8 is bent to lie upon the point portion of the other piercing portion 7 in a manner as to give force to the same in the direction to the flat part 6.

Figure 10:
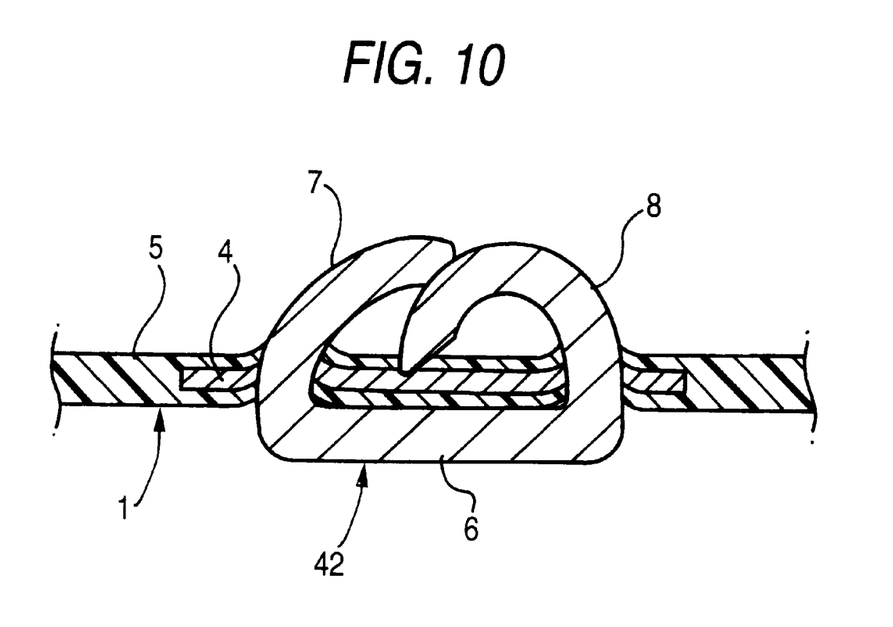
FIG. 10 is a view taken along X—X of FIG. 8.

On the other hand, as shown in FIG. 10, the pair of piercing parts 7, 8 standing at the distal end side of the flat part 6 are connected to the flat circuit body 1, where the piercing parts 7, 8 penetrate the cover 5 and the electric conductor 4, and the point portion of one piercing part 8 is bent back to the flat part 6 to again pierce the electric conductor 4 and the point portion of the other piercing part 7 urges the point portion of the piercing part 8 in the direction of the flat part 6 to lie upon the point portion of the one piercing part 8, so that the piercing parts 7, 8 are connected to the flat circuit body 1.

In this manner, as shown in FIG. 5, also when the pair of piercing parts 7, 8 are not simultaneously in contact with the corresponding molding faces 25a, 25b at the time of crimping, one pair will offset the other pair with a twist force effected by reverse inclination. Therefore, the inclination of electrically connecting terminal 42 as shown in FIG. 6 is prevented, and good crimping may be exactly carried out.

It is, therefore, not necessary to strictly take care of the molding faces 25a, 25b to have the center of curvature and the radius of curvature of the dimension for simultaneously contacting the point portions of the piercing parts 7, 8 to the molding faces 25a, 25b. Thus, the supervision of processing precision may be simplified.

Of course, the terminal crimping method and the apparatus therefor of the invention is not limited to the above embodiment, and various modifications are available in accordance with the subject matter of the invention.

For example, the molding faces 25a, 25b of the upper crimper 25 in the terminal crimping apparatus 21 of the embodiment are structured such that one piercing part 8 lies upon the other piercing part 7. The terminal crimping apparatus may be applied to such a terminal crimping apparatus shown in FIG. 12 where the molding faces 13a, 13b of the upper crimper 13 are so formed as to bend back the piercing parts 7, 8 toward each other in the same configuration.

Figure 17:
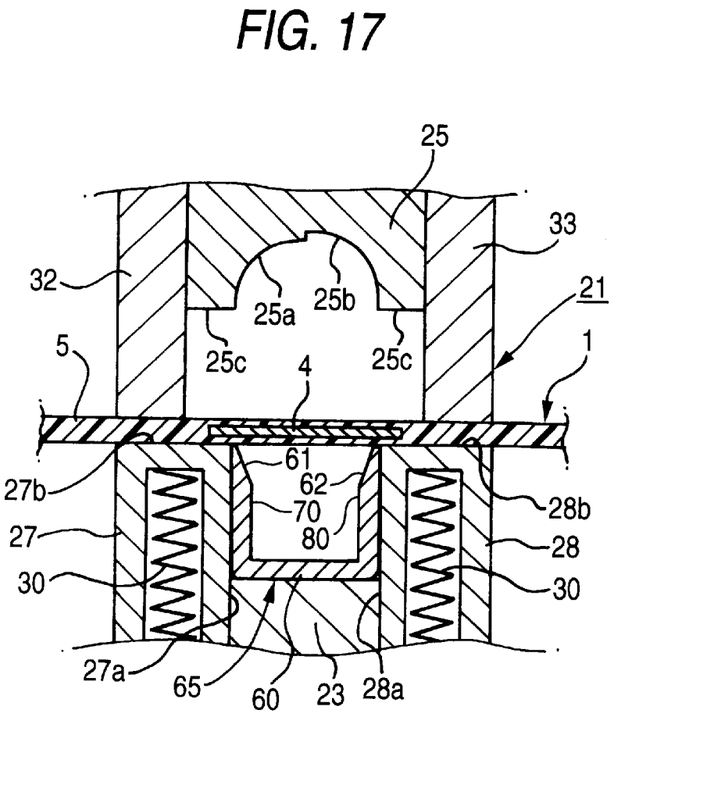
FIG. 17 is a cross sectional view for explaining the terminal crimping method by use of the terminal crimping apparatus relating to a modification of the invention.
Figure 18:
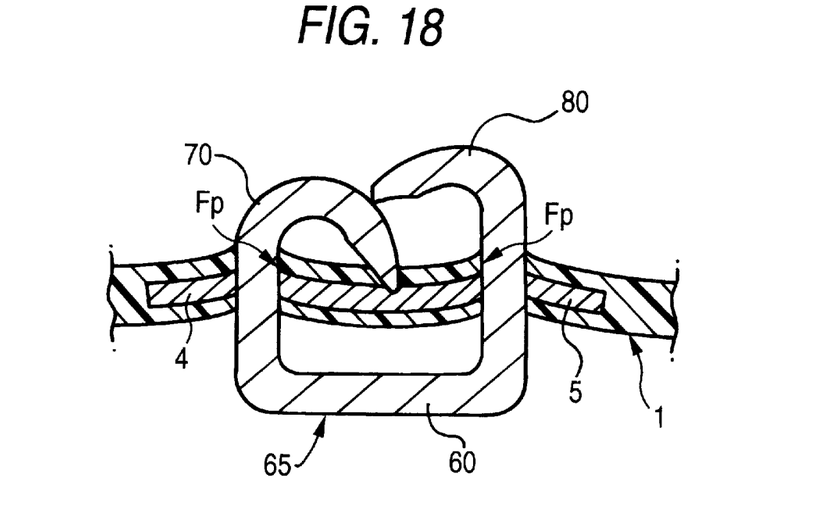
FIG. 18 is a laterally cross sectional view of the electrically connecting terminal crimped to the flat circuit body by the apparatus shown in FIG. 17.

FIGS. 17 and 18 show a modification of the above embodiment. The modification has the same structure in the above embodiment except shape of a point portion of piercing part 70 provided at an electrically connecting terminal 65. Therefore, explanation regarding the common structure between the above embodiment and the modification is omitted.

As shown in FIG. 17, each piercing part 70 (80) projected from a flat portion 60 of the electrically connecting terminal 65 is provided with a taper surface 61 (62), thereby the point portion of the piercing part is substantially triangular cross section and the thickness of the piercing parts is gradually decreased toward the point portion. The structure of the electrically connecting terminal 65 except regarding the taper surface is substantially same to that of the electrically connecting terminal 24 in the above embodiment.

Next, explanation will be made to a crimping process of the electrically connecting terminal 65 by the terminal crimping apparatus 21. Since the crimping process of the electrically connecting terminal 65 is almost similar to the crimping process of the electrically connecting terminal 65 in the above embodiment, the explanation of the common part is omitted and only the different part is explained.

As explained in the above embodiment, the electrically connecting terminal 65 penetrates the flat circuit body by moving down the upper crimper 25. In this time, i.e., when piercing parts 70, 80 penetrate the cover 5 and conductor 4 of the flat circuit body 1, drag as to compress and curve the conductor 4 inwardly with respect to the pair of piercing parts is generated cause of the taper surfaces 61, 62. This drag urges the piercing parts to open outwardly, however, since the terminal guides 27 and 28 are provided, the outward movement of the piercing parts is certainly restricted (the piercing parts are always guided by the terminal guide). Therefore, outwardly displacement as well as inwardly displacement of the piercing parts is prevented.

As shown in FIG. 18, since the conductor 4 between the pair of piercing parts 61 and 62 is compressed and curved inwardly by the drag in the crimping process, compression stress Fp is generated between the piercing parts and the conductor, thereby contact pressure of a sear plane of the conductor with respect to each piercing part can be enhanced.

Accordingly, even if a return is generated on the point potion of the piercing portions 25 and 26 by a spring back after folding and molding, deterioration of conducting reliability due to reducing the contact pressure between the shear plane and the piercing parts can be prevented.

According to the terminal crimping method and the apparatus therefor of the invention, the upper crimper is relatively moved toward the lower crimper to have the point portions of the piercing parts of the electrically connecting terminal pass through the flat circuit body and deform the same by bending toward each other. In this case, the flat circuit body is sandwiched by the circuit body holders and the terminal guides which are relatively movable along the outer side of the piercing parts, while the piercing parts of the electrically connecting terminal are prevented from falling by the terminal guides.

In the crimping process of conductively connecting the electrically connecting terminal to the flat circuit body, when the piercing parts pass through the flat circuit body, the flat circuit body is avoided from fine displacement or vibration in the face direction and a part to be pierced is made tense. Therefore, the relative positions between the flat circuit body 1 and the piercing parts are stabilized to enable the piercing parts to pass through the flat circuit body 1 in a balanced condition.

Further, the piercing parts of the electrically connecting terminal prevented from falling by the terminal guides may be correctly bent toward each other without deviation.

Thus, there less occurs poor crimping by buckling of the piercing parts, and the crimping process of a high quality is available.

What is claimed is:

1. A terminal crimping method of electrically connecting an electrically terminal having a pair of piercing parts and a flat part to a flat circuit body including a cover and a conductor therein by a terminal crimping apparatus including an upper crimper, a lower crimper, a terminal guide and a circuit body holder the terminal crimping method comprising the steps of:

placing the electrically connecting terminal on the lower crimper;

guiding the pair of piercing parts by the terminal guide relatively movable along outer sides of the pair of piercing parts;

elastically holding the flat circuit body disposed between the upper crimper and the lower crimper by the terminal guide and the circuit body holder;

relatively moving the upper crimper toward the lower crimper;

piercing the cover and the conductor by point portions of the pair of piercing parts; and bending the point portions of the pair of piercing parts so as to approach each other by a molding face of the upper crimper.

2. The terminal crimping method according to claim 1, wherein one of the pair of piercing parts penetrating through the flat circuit body is bent back toward the flat part to penetrate through the conductor by the molding face of the upper crimper, and the point portion of the other piercing part is laid upon the point part of the one of the pair of piercing parts so that the one of the pair of piercing parts is urged toward the flat part.

3. The terminal crimping method according to claim 1, wherein in the bending step, the point portions of the pair of piercing parts are simultaneously brought into contact with the molding face.

4. The terminal crimping method according to claim 2, wherein in the bending step, the point portions of the pair of piercing parts are simultaneously brought into contact with the molding face.

5. A terminal crimping apparatus for electrically connecting an electrically connecting terminal having a pair of piercing parts and a flat part to a flat circuit body having a cover and a conductor therein, the terminal crimping apparatus comprising:

a lower crimper which supports a lower side of the flat part;

an upper crimper arranged above to the lower crimper having a molding surface for bending point portions of the pair of piercing parts by relatively moving toward the lower crimper;

a terminal guide movable along outer sides of the pair of piercing parts for guiding the pair of piercing parts; and a circuit body holder arranged above and opposite to the terminal guide for elastically holding the flat circuit body in cooperation with the terminal guides during the upper crimper moves toward the lower crimper.

6. The terminal crimping apparatus according to claim 5, wherein one of the pair of piercing parts penetrating through the flat circuit body is bent back toward the flat part to penetrate through the conductor by the molding face of the upper crimper, and the point portion of the other piercing part is laid upon the point part of the one of the pair of piercing parts so that the one of the pair of piercing parts is urged toward the flat part.

7. The terminal crimping apparatus according to claim 5, wherein the mold face is so formed that the point portions of the pair of piercing parts are simultaneously brought into contact with the molding face.

8. The terminal crimping apparatus according to claim 6, wherein the mold face is so formed that the point portions of the pair of piercing parts are simultaneously brought into contact with the molding face.

9. The terminal crimping apparatus according to claim 7, wherein the mold face includes a first face for bending one of the point portions of the pair of piercing parts and a second face for bending the other point portions of the pair of piercing parts, and the first face and the second face have different dimensions of center of curvature and radius of curvature.

10. The terminal crimping apparatus according to claim 5, wherein a taper surface for gradually reducing a thickness of the pair of piercing portion is formed in an internal surface of each piercing portion.

* * * * *